United States Patent [19]
He et al.

[11] Patent Number: 6,002,160
[45] Date of Patent: Dec. 14, 1999

[54] SEMICONDUCTOR ISOLATION PROCESS TO MINIMIZE WEAK OXIDE PROBLEMS

[75] Inventors: Yue Song He; Yowjuang William Liu, both of San Jose, Calif.

[73] Assignee: Advanced Micro Devices, Inc., Sunnyvale, Calif.

[21] Appl. No.: 08/989,820

[22] Filed: Dec. 12, 1997

[51] Int. Cl.⁶ .......................... H01L 29/00; H01L 23/58; H01L 29/76
[52] U.S. Cl. .................... 257/513; 257/506; 257/510; 257/639; 257/649; 257/410; 257/411
[58] Field of Search ................... 257/506, 510, 257/513, 639, 649, 410, 411

[56] References Cited

U.S. PATENT DOCUMENTS

| | | | |
|---|---|---|---|
| 4,944,836 | 7/1990 | Beyer et al. | 156/645 |
| 5,084,071 | 1/1992 | Nenadic et al. | 51/309 |
| 5,410,176 | 4/1995 | Liou et al. | 257/513 |
| 5,498,891 | 3/1996 | Sato | 257/513 |
| 5,668,403 | 9/1997 | Kunikiyo | 257/639 |

*Primary Examiner*—Steven H. Loke
*Attorney, Agent, or Firm*—Foley & Lardner

[57] ABSTRACT

A semiconductor isolation structure comprising: a semiconductor substrate with a plurality of trenches formed therein with substantially vertical sidewalls, the plurality of trenches defining at least one mesa of semiconductor material; wherein only top corners of the mesa have been converted to an oxide containing a heavy ion implant; and an insulator material filling the plurality of trenches.

2 Claims, 2 Drawing Sheets

SEMICONDUCTOR ISOLATION PROCESS TO MINIMIZE WEAK OXIDE PROBLEMS

BACKGROUND OF THE INVENTION

The present invention relates generally to methods for forming integrated circuit chips, and more particularly, to a method for substantially eliminating tunnel oxide thinning and weak oxide problems resulting from the trench-forming isolation process.

An integrated circuit chip comprises an array of devices formed in a semiconductor substrate, with the contacts for these devices interconnected by patterns of conductive wires. These devices must be isolated from each other in order to properly function. One method used in the art to isolate CMOS circuits is the use of isolation trenches with vertical sidewalls. Such isolation trenches are advantageous in that they have a significantly smaller width than standard LOCOS isolation field oxide regions of the same depth. However, it has been discovered that the dry etching techniques utilized to form the deep isolation trenches tend to damage the silicon at the top of the mesas of silicon bordering the isolation trench. Specifically, the plasma molecules bombarding the silicon damage the silicon lattice resulting in a rough surface. In succeeding steps when tunnel oxide is grown on top of the silicon mesas, the oxide quality at the damaged edges of the mesas is thin and relatively weak. If the gate region for transistors is formed in the damaged silicon below these weak oxide areas, then there is a high potential for shorting of the gate through the oxide. This is a particular problem for floating gate structures formed in integrated circuits. Such floating gate structures receive data by means of electron tunnelling across a tunnel oxide up to the gate. It has been discovered that if a corner of the tunnel oxide contains defect sites caused by a damaged silicon layer thereunder, then electrons can leak back out of the gate through these defect sites, thereby losing the data on the gate and causing data retention problems. Additionally, if substantial electron tunneling occurs at the location of the thin oxide at a corner (which would tend to occur since the thinness of the corner makes that location the path of least resistance), then a tunnel oxide breakdown and short at that point can occur. This presents a significant reliability problem for chips utilizing such an isolation process.

SUMMARY OF THE INVENTION

Briefly, the present invention comprises a process for forming an isolation region while substantially eliminating weak oxide effects, comprising the steps of: obtaining a semiconductor substrate patterned with a plurality of mesas with sidewalls, with semiconductor substrate exposed in areas between the mesas, each of the mesas comprising at least a first insulator layer and a second different insulator later thereover; forming a trench between the mesas into the exposed semiconductor substrate; removing a lateral portion of the first insulator layer exposed at the sidewalls of the mesas to thereby undercut the second insulator layer at its sidewall edges; forming an oxide layer on exposed areas of the semiconductor substrate below the undercut of the second insulator layer; and filling the trench with an insulator material.

In a preferred embodiment of the present invention, after the lateral portion removal step, and before the oxide forming step, implanting material into an area in the semiconductor substrate exposed below the undercut edges of the second insulator material where the lateral portion of the first insulator layer is removed.

In a yet further aspect of this preferred embodiment, the implanting step comprises the step of implanting nitrogen atoms and ions using a large angle of implant.

In a further aspect of the present invention, the first insulator layer is an oxide layer and the second insulator layer is a nitride layer and the semiconductor substrate is silicon.

In a further aspect of the invention, the inventive process comprises the steps of: after the trench filling step chemical-mechanical polishing down to approximately the top of the second insulator layer; removing the first and second insulator layers to expose the semiconductor substrate thereunder; and forming a tunnel oxide on the exposed semiconductor substrate.

In a further aspect of the invention, a semiconductor isolation structure is provided comprising a semiconductor substrate with a plurality of trenches formed therein with substantially vertical sidewalls, with the plurality of trenches defining at least one mesa of semiconductor material; wherein the top corner of the mesas has been converted to an oxide; and an insulator material filling the plurality of trenches.

In a yet further aspect of this embodiment of the invention, the top corner of the mesa contains a heavy ion implant.

In a yet further aspect of the invention, the top corner of the mesa contains a nitrogen implant.

DETAILED DESCRIPTION OF THE PREFERRED EMBODIMENTS

Figure 1:
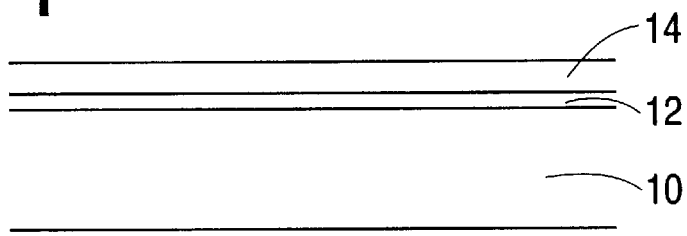
FIG. 1 is a side view of a semiconductor substrate with a first and a second insulation layers thereover.

Referring now to the drawings, these drawings are provided to illustrate one exemplary implementation of the present invention, and are not intended to be limiting in their scope. Additionally, it should be noted that these drawings are illustrative in nature and thus, are not drawn to scale. Additionally, it should be noted that various well-known process and clean steps will not be recited in the present description in order to properly focus the disclosure on the invention.

Referring now to FIG. 1, there is illustrated a semiconductor substrate 10 which, in an exemplary embodiment, comprises a silicon substrate. However, it should be noted that other semiconductor materials could be substituted such as germanium and the like. By way of example, this silicon substrate 10 may be single crystal P-type silicon with an orientation which is most likely [100]. A thin layer of insulator 12 is formed over the silicon substrate 10. This insulator layer 12 may conveniently comprise a thermally grown $SiO_2$ and is typically referred to as a pad oxide layer. This pad oxide layer 12 may be thermally grown typically to a thickness on the order of 250 Å. Formed over the insulator layer 12 is a second different insulator layer to function as an oxidation mask. By way of example, the second different insulator layer 14 may comprise a silicon nitride layer formed by means of a CVD process to a thickness typically in the range of 1700 Å.

Figure 2:
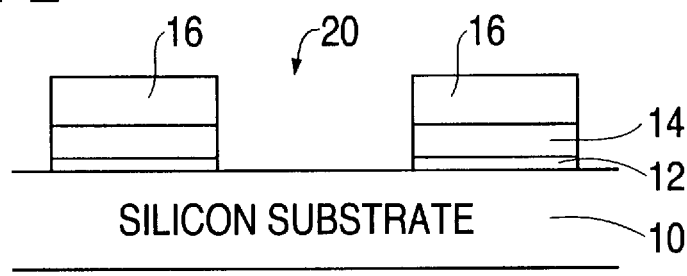
FIG. 2 is a side view of the semiconductor substrate of FIG. 1 with the first and second insulation layers patterned by means of a photoresist mask.

Referring now to FIG. 2, the semiconductor device of FIG. 1 is shown with a patterned photo-resist layer 16 formed thereon. The resist pattern is used to protect the areas where active devices will be formed. This patterning of the resist may be accomplished by means of standard photolithograph and etching techniques which are well-known in the art. The photolithography process would typically involve selectively exposing the photo-resist layer to UV radiation and then processing the photo-resist layer to remove those sections which were exposed to the UV radiation. The silicon nitride layer 14 and the pad oxide layer 12 may then be etched using appropriate standard dry etching solutions.

Figure 3:
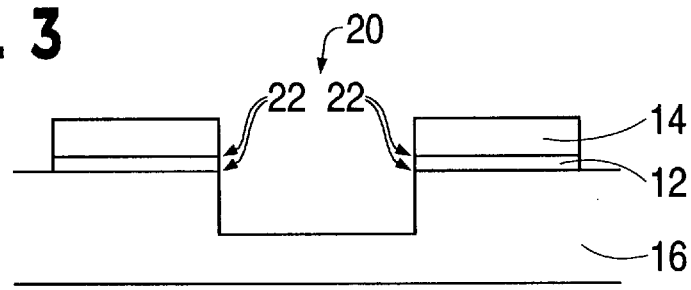
FIG. 3 is a side view of the semiconductor substrate of FIG. 2 after an anisotropic etch step.

Referring now to FIG. 3, the semiconductor device of FIG. 2 is shown after the formation of a trench region 20. The trench 20 is formed by means of an anisotopric directional etch applied to the area not covered by the patterned mesas of pad oxide 12 and nitride 14. Because a directional etch is utilized, the sidewalls of the resulting trench 20 are substantially vertical. By way of example this directional etch is typically performed to a depth of 3,000 Å to 4,000 Å.

It has been discovered that the regions 22 on the sidewalls of the trench 20 at the corner where the silicon layer 10 interfaces with the pad oxide layer 12 tend to be damaged during the directional etch process. In later device processing when the nitride layer 14 and the pad oxide layer 12 are removed and a tunnel oxide layer is formed on the mesa of silicon remaining, the rough surface of these damaged corners of the silicon mesa cause the tunnel oxide grown thereon to be thin and relatively weak.

Figure 4:
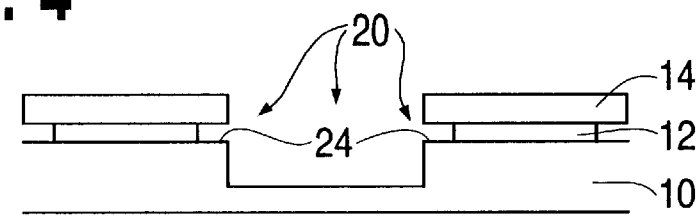
FIG. 4 is a side view of the substrate of FIG. 3 after an etching undercut step and an ion implantation step.

Referring now to FIG. 4, the semiconductor device of FIG. 3 is shown after the performance of an etch process to remove a lateral portion of the pad oxide layer 12 and, in a preferred embodiment, to implant material in this exposed corner of silicon which will reduce oxidation encroachment during subsequent oxidation steps. Specifically, an etch process step is applied to the semiconductor device to remove a lateral portion of the pad oxide layer 12 which is exposed at the sidewalls of the trench 20 to thereby undercut the second insulator layer of nitride 14 at its sidewall edges. By way of example, but not by way of limitation, this lateral etching step may etch approximately 100 Å into the first insulator layer 12 of oxide. Any etching process may be utilized which selectively etches the first insulator layer 12 but does not etch the second insulator layer 14 or the silicon substrate 10 therebelow. By way of example, but not by way of limitation, the etch process may comprise the use of a dilute HF dip (1:100 solution) to remove part of the oxide pad 12 to yield a slow controlled etch.

In a preferred embodiment of the present invention, it has been found to be particularly advantageous to implant or insert in some fashion into the newly exposed silicon surface 24, a material which will function to reduce encroachment of oxide into the silicon in subsequent oxidation steps. In essence, this material implanted or inserted is for the purpose of controlling and reducing the oxidation rate of the silicon at the point of the implant. By way of example, but not by way of limitation, nitrogen may be implanted in order to effect this oxidation rate control on the newly exposed silicon surfaces 24. By way of example, this implantation step may be accomplished by directing low energy N atoms and molecules at an angle in the range of 45°–60° from vertical with an energy of approximately 10–20 KEV to achieve a dosage of about 1E14–5E14.

Figure 5:
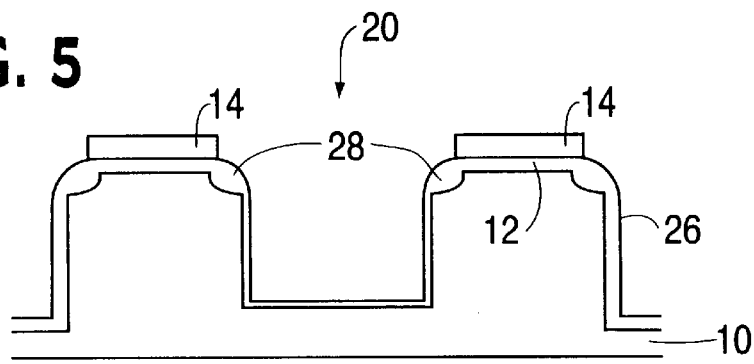
FIG. 5 is a side view of the device of FIG. 4 after an oxidation step.

Referring now to FIG. 5, the semiconductor device of FIG. 4 is shown after an oxidation step to grow a layer of oxide 26 on the sidewalls of the trench 20. The purpose of this oxidation step is to grow oxide 28 into the damaged corners of silicon by a controlled amount. By way of example, but not by way of limitation, the oxide may be grown at a temperature in the range of 1000° C. for forty minutes to approximately 1 hour. If a material implant is utilized in the corners 24, as described in the preferred embodiment, then this oxide formation at the damaged corners 28 will be on the order of 400–500 Å.

Figure 6:
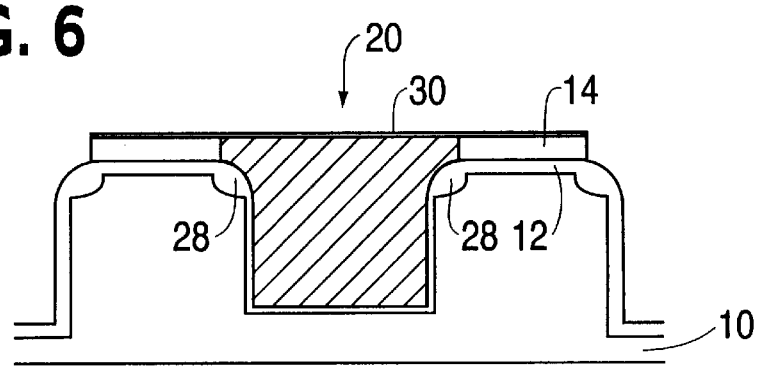
FIG. 6 is a side view of the device of FIG. 5 after a trench-filling step.

Referring now to FIG. 6, the semiconductor device of FIG. 5 is shown after the trench 20 has been filled with an insulator material 30. By way of example, but not by way of limitation, this trench 24 may be filled with a CVD oxide. Following this CVD oxide deposition step, the semiconductor device may be polished to planarize the surface, to the form shown in FIG. 6. By way of example, this polishing step may be accomplished by means of chemical-mechanical polishing. Chemical-mechanical (CMP) polishing processes employ both a chemical and a mechanical component. A rotating or vibrating disk or pad is moved relative to the semiconductor wafer surface in the presence of a chemical-mechanical polishing slurry. This CMP slurry includes suspended solids as well as a chemical solution component which attacks the material being polished. The two processes in combination etch the upper layer of a wafer by chemical and mechanical action which removes high points much faster than the low points on the wafer surface. Typical. chemical-mechanical polishing methods and slurries are disclosed in U.S. Pat. Nos. 4,944,836 and 5,084,071. The result of this chemical-mechanical polishing process is a substantially flattened upper surface.

Figure 7:
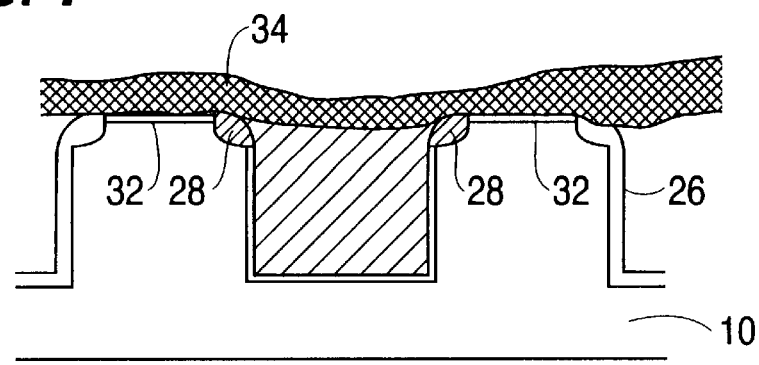
FIG. 7 is a side view of the device of FIG. 6 after the removal of the first and second insulation layers and the deposit of a tunnel oxide layer and a polysilicon layer thereover.

Referring now to FIG. 7, the semiconductor device of FIG. 6 is shown after a tunnel oxide deposition step and the deposition of a layer of polysilicon. Initially, the nitride layer 14 is removed with a wet etch that is selective to nitride and the pad oxide layer is removed with an etch such as, for example, a HF etch. The removal of the nitride layer and the pad oxide layer exposes silicon in the silicon substrate 10 where the transistor devices are to be formed. Next, a thin layer of sacrificial oxide on the order of about 200 Å is grown followed by a sacrificial oxide removal step. Then, a layer 32 of tunnel oxide is thermally grown on the surface of the silicon. Finally, a conductive polysilicon layer 34 is deposited thereover, by way of example, by a CVD process. This polysilicon layer may be amorphous polysilicon and may include doping, or doping may be added after deposition to provide a desired conductivity. A typical doping concentration for this polysilicon layer 34, which is set forth by way of example, and not by way of limitation, is phosphorus at 5E19 per $cm^3$. This polysilicon layer 34 typically will be deposited to a thickness on the order of 700–1100 Å.

Accordingly, it can be seen that a semiconductor device is formed wherein the active regions in the tunnel oxide area are prevented from extending into the damaged area of silicon by the oxide growth regions 28. Thus, this process avoids and the resulting device avoids data retention problems caused by electron leakage through defect sites and further avoids substantial electron tunneling through defect sites that may cause tunnel oxide breakdown and shorting.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor isolation structure comprising:

a semiconductor substrate with a plurality of trenches formed therein with substantially vertical sidewalls, said plurality of trenches defining at least one mesa of semiconductor material;

wherein only top corners of said mesa have been converted to an oxide containing a nitrogen implant; and an insulator material filling said plurality of trenches.

2. A semiconductor isolation structure as defined in claim 1, wherein said semiconductor substrate is silicon and said insulator material is an oxide.

* * * * *